(12) United States Patent
Jeon

(10) Patent No.: US 9,777,395 B2
(45) Date of Patent: Oct. 3, 2017

(54) SILICON SINGLE CRYSTAL GROWING DEVICE AND METHOD OF GROWING THE SAME

(71) Applicant: LG Siltron Inc., Gyeongsangbuk-do (KR)

(72) Inventor: Su-In Jeon, Gyeongsangbuk-do (KR)

(73) Assignee: LG Siltron, Inc., Gyeongsangbuk-Do (KR)

( * ) Notice: Subject to any disclaimer, the term of this patent is extended or adjusted under 35 U.S.C. 154(b) by 0 days.

(21) Appl. No.: 14/418,820

(22) PCT Filed: Jun. 5, 2014

(86) PCT No.: PCT/KR2014/005003
§ 371 (c)(1),
(2) Date: Jan. 30, 2015

(87) PCT Pub. No.: WO2014/204119
PCT Pub. Date: Dec. 24, 2014

(65) Prior Publication Data
US 2016/0102419 A1   Apr. 14, 2016

(30) Foreign Application Priority Data

Jun. 21, 2013   (KR) .................. 10-2013-0071494

(51) Int. Cl.
*C30B 15/20*  (2006.01)
*C30B 29/06*  (2006.01)
(Continued)

(52) U.S. Cl.
CPC ............ *C30B 15/206* (2013.01); *C30B 15/14* (2013.01); *C30B 15/26* (2013.01); *C30B 29/06* (2013.01)

(58) Field of Classification Search
CPC combination set(s) only.
See application file for complete search history.

(56) References Cited

U.S. PATENT DOCUMENTS 586,737 A * 7/1897 Hiraishi ............... E02F 3/7604
                                                172/197
5,087,321 A  2/1992 Kamio et al.
(Continued)

FOREIGN PATENT DOCUMENTS

CN         1034400 A      8/1989
JP        60-067877       4/1985
(Continued)

OTHER PUBLICATIONS

Machine translation of JP2007-204332.*
(Continued)

*Primary Examiner* — Duy Deo
*Assistant Examiner* — Erin Bergner
(74) *Attorney, Agent, or Firm* — Lewis Roca Rothgerber Christie LLP

(57) ABSTRACT

An apparatus for growing a silicon single crystal according to embodiments includes a chamber including a crucible accommodating silicon melt; a support shaft rotating and lifting the crucible while supporting the crucible; a main heater part for applying heat to the crucible side, the heater disposed beside the crucible; an upper heat insulation member located over the crucible; and upper heater parts located at a lower end portion of the upper heat insulation member, wherein the upper heater parts have diameters different from each other with respect to a center of the crucible, and include a plurality of ring-shaped heaters which are spaced apart from each other. Due to the individually controllable upper heater parts, a uniform thermal environment can be provided for silicon melt accommodated in a crucible, and localized solidification of the silicon melt can be prevented so that the quality of a silicon single crystal and the ingot pulling speed can be readily controlled.

10 Claims, 4 Drawing Sheets

(51) Int. Cl.
*C30B 15/14* (2006.01)
*C30B 15/26* (2006.01)

(56) References Cited

U.S. PATENT DOCUMENTS

2004/0112277 A1\* 6/2004 Kulkarni ................. C30B 15/14
117/13
2007/0215038 A1 9/2007 Iida et al.
2012/0210931 A1\* 8/2012 Bender ................... C30B 15/02
117/15

FOREIGN PATENT DOCUMENTS

| JP | 01-153589 | 6/1989 |
| JP | 05-294782 | 11/1993 |
| JP | 09-235175 | 9/1997 |
| JP | 2001-122689 | 5/2001 |
| JP | 2003-165791 | 6/2003 |
| JP | 2005-053722 | 3/2005 |
| JP | 2007-204332 | 8/2007 |
| KR | 10-2007-0001203 | 1/2007 |
| KR | 10-2011-0016843 | 2/2011 |
| WO | 2005-095680 | 10/2005 |

OTHER PUBLICATIONS

Office Action for Application No. 2015-528422 with google translation (6 pages).
SIPO Office action dated Jun. 30, 2016 issued in corresponding Application No. 201480002128.X, with English translation, 11 pages.
International Search Report dated Sep. 22, 2014.

\* cited by examiner

SILICON SINGLE CRYSTAL GROWING DEVICE AND METHOD OF GROWING THE SAME

CROSS-REFERENCE TO RELATED APPLICATIONS

The present application is a national phase application of PCT application PCT/KR2014/005003 filed Jun. 5, 2014, which claims the priority benefit of Korean patent application 10-2013-0071494 filed Jun. 21, 2013, the disclosures of which are incorporated herein by reference.

BACKGROUND OF THE INVENTION

Technical Field

The present disclosure relates to an apparatus for growing a single crystal and a method for growing a silicon single crystal, and more particularly to an apparatus for growing a single crystal and a method for growing the same, which provide a thermal environment in which silicon melt accommodated in a crucible can be quickly melted inside the crucible.

Background Art

In general, silicon single crystals used as substrates for manufacturing semiconductor devices are manufactured by using the Czochralski (Cz) method. In the Cz method, silicon single crystals are introduced into a quartz crucible, and then the crucible is heated, so that a single crystal seed contacts silicon melt and is then grown to produce a single crystal while being slowly pulled upwards.

Most crystal manufacturing apparatuses are made of steel, have a circular shape, and include a heat insulation member for blocking heat therein, a heating element for melting silicon, a graphite crucible surrounding a quartz crucible, a support shaft supporting the crucible, and so forth. These inner structures are referred to as a "Hot zone".

In order to grow a high quality silicon single crystal, a thermal environment around an interface is uniformly formed and maintained, so that the quality of the single crystal and the pulling speed should be maintained and the pulling speed should be readily controlled even though the single crystal grows to a greater length. More specifically, the silicon melt continuously receives heat from the heater, and the loss of heat is blocked by a heat shielding structure, so that a predetermined temperature gradient is maintained.

However, as the silicon ingot comes to have a larger diameter, the size standard for an apparatus for growing a single crystal becomes greater, and more particularly, when a crucible becomes larger, poly silicon to be melted in the crucible cannot be liquefied in a short time, so that the process time for growing a single crystal becomes longer. Also, when a solidification of silicon melt is locally generated because the silicon melt itself cannot be maintained at a uniform temperature, there are problems in that a loss is generated in a silicon single crystal which is to be grown, and the quality of the grown single crystal is also affected. Also, there is a problem in that a loss occurs in a silicon single crystal because a non-uniform temperature distribution occurs at the surface of the melt and inside the melt in a crystal growing process.

SUMMARY OF THE PRESENTLY CLAIMED INVENTION

Technical Problem

Embodiments provide an apparatus for growing a silicon single crystal and a method for growing the same, which can provide a uniform thermal environment for silicon melt accommodated in a crucible.

Embodiments also provide an apparatus for growing a silicon single crystal and a method for growing the same, which can improve the crystal quality of a silicon single crystal and the total process speed through quick liquefaction of inputted poly silicon inside the crucible.

Technical Solution

In one embodiment, an apparatus for growing a single crystal includes a chamber including a crucible accommodating silicon melt; a support shaft rotating and lifting the crucible while supporting the crucible; a main heater part disposed beside the crucible to apply heat to the crucible side; an upper heat insulation member located over the crucible; and an upper heater part located at a lower end portion of the upper heat insulation member, wherein the upper heater part includes a plurality of ring-shaped heaters which are spaced apart from each other, and have different diameters from each other with respect to a center of the crucible.

Also, in another embodiment, a method for growing a single crystal includes the steps of: filling a crucible, which is disposed inside a process chamber, with poly silicon and melting the poly silicon through heat generated from a main heater part disposed at a side surface of the crucible and an upper heater part disposed over the poly silicon; and dipping a seed in the crucible, then performing a shoulder process, a body process, and a tail process to grow a silicon single crystal ingot, wherein the method heats the main heater part and also heats only a portion of heaters disposed at an upper heater part according to temperature information on a solid-liquid interface of the poly silicon melt, in the steps of melting the poly silicon filled in the crucible, and performs a shoulder process, a body process, and a tail process.

Advantageous Effects

According to embodiments, a uniform thermal environment can be provided for silicon melt accommodated in a crucible, and localized solidification of the silicon melt is prevented, so that the quality of a silicon single crystal and the pulling speed of an ingot can be readily controlled.

According to embodiments, the thermal environment around the interface of a silicon single crystal can be controlled, so that poly silicon is quickly melted in a crucible, and there is an effect in that the process time required to grow a single crystal can be reduced.

DETAILED DESCRIPTION

Hereinafter, the present embodiment will be described in detail with reference to the accompanying drawings. However, the technical scope of the embodiments will fall within the scope of this disclosure, and the addition, deletion and modification of components or parts are possible within the scope of the embodiments.

Figure 1:
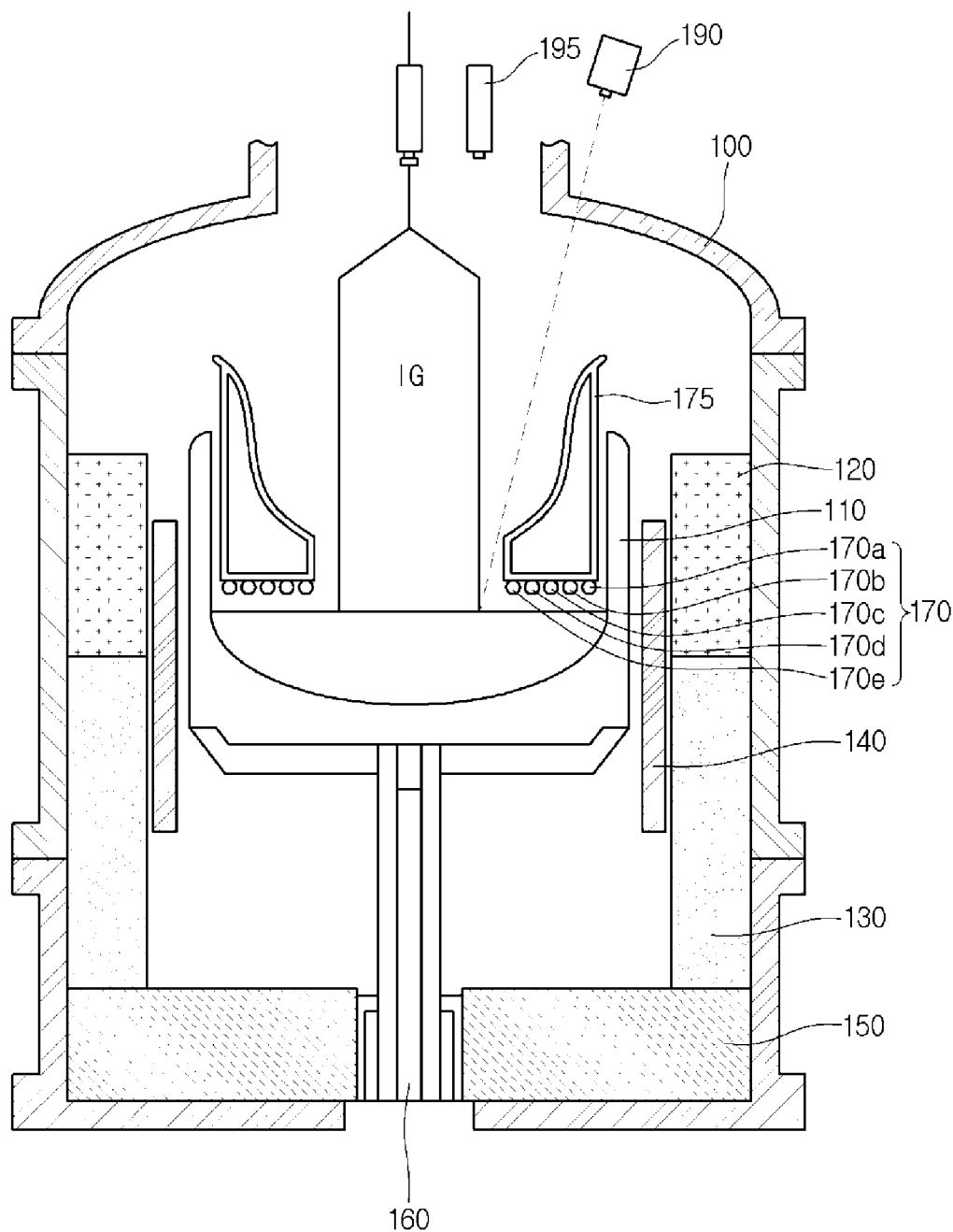
FIG. 1 is a cross-sectional view illustrating an apparatus for growing a single crystal according to a first embodiment.

FIG. 1 is a cross-sectional view illustrating an apparatus for growing a single crystal according to a first embodiment.

Referring to FIG. 1, as illustrated above, the apparatus for growing a single crystal includes: a chamber 100 including a crucible 110 accommodating silicon melt; a support shaft 160 for rotating and lifting the crucible 110 while supporting the crucible 110; a main heater part 140 disposed beside the crucible 110 to apply heat to the crucible 110 side; a side surface heat insulation member 130 disposed in a side direction of the main heater part 140; a side upper heat insulation member 120 located on the side surface heat insulation member 130; an upper heater part 170 including a plurality of heater parts 170 for generating heat over the silicon melt; and an upper heat insulation member 175 for blocking the heat generated from the heater part 170.

In preparing a silicon single crystal using the apparatus for growing a single crystal, poly silicon is accommodated inside a crucible 110, and is then heated by the main heater part 140 so as to be melted into silicon melt. Then, a single crystal ingot is grown from the silicon melt. That is, the time, in which poly silicon is melted inside the crucible 110, becomes longer as the crucible 110 comes to have a larger diameter in a step for growing a silicon single crystal after the poly silicon is melted by the Czochralski method, so that the yield of the single crystal ingot is decreased. Also, since the heat generated at the main heater part 140 is convected into the silicon melt, temperature control at a solid-liquid interface is not easy, so that there is difficulty in preparing a high quality silicon single crystal.

In order to solve such a loss, embodiments propose an apparatus for growing a single crystal, which includes an upper heater part 170 including a heater spaced apart from a surface of the silicon melt by a predetermined distance, thereby allowing the heat history of the silicon melt to be readily controlled.

Referring to FIG. 1, the upper heater part 170 proposed in embodiments will be described in detail. FIG. 1 is a first embodiment of the upper heater part 170, and each of a plurality of heaters 170a, 170b, 170c, 170d, and 170e disposed in the upper heater part 170 is formed to have a ring shape. That is, each of a plurality of heaters 170a, 170b, 170c, 170d, and 170e has a circular ring shape surrounding a silicon single crystal ingot, is formed to have a different diameter from each other about the silicon ingot, and is disposed to be spaced apart from each other by a predetermined distance.

In the figures of embodiments, the number of heaters of the upper heater part 170 is illustrated to be five heaters as a preferred example for controlling the growth of a silicon single crystal ingot, but is not limited thereto, and the controlling can be applied to all embodiments with at least two or more heaters.

Also, although not illustrated in FIG. 1, each of a plurality of heaters 170a, 170b, 170c, 170d, and 170e disposed in the upper heater part 170 of embodiments is connected to a control unit, and each of the heaters 170a, 170b, 170c, 170d, and 170e can be individually operated according to controlling by the control unit. That is, since the temperature gradient along a diameter direction about the silicon single crystal ingot may be constantly controlled by the individual operation of the heaters disposed in the upper heater part 170, a high quality silicon single crystal ingot may be grown.

Accordingly, a plurality of pyrometers 195 for measuring the temperature of the silicon melt may be disposed at an upper portion of the chamber in a diameter direction of the silicon single crystal ingot. That is, the pyrometers measure the temperature of the silicon melt, determine a position with an unstable temperature or a position higher or lower than a neighbor of the position, and transmit information about a temperature gradient along the diameter direction.

Also, a camera 190 may be disposed outside the chamber. The camera 190 captures image information on a solid-liquid interface from the outside of the chamber, and may determine a temperature through shape or color information on the solid-liquid interface. The camera 190 is also connected to the control unit, determines a temperature state of the solid-liquid interface in real time, and transmits the temperature state to the control unit, so that the temperature state of the solid-liquid interface may be flexibly controlled.

Also, when the temperature of the silicon melt is low or high at a specific position, the control unit turns the specific heater of the upper heater part 170 located over the specific position on or off according to a user's selection, or sets the power level differently, so that the temperature gradient of the silicon melt may be constantly maintained. Also, the control unit increases the power of a specific heater in the upper heater part 170 located over a position with a low measured temperature, applies heat to an area in which the silicon melt is solidified or not liquefied, and decreases a temperature deviation along a diameter direction of the silicon melt, so that the single crystal ingot yield may be increased.

That is, each of the heaters 170a, 170b, 170c, 170d, and 170e disposed in the upper heater part 170 is integrally formed, and is spaced apart from the silicon melt by a predetermined distance, and thus temperatures may be controlled for the entire surface of the silicon melt. Since the upper heater part 170, which is turned on, intensively heats the surface of the silicon melt located thereunder, vertical forced convection and horizontal natural convection are activated near the surface of the melt. Here, the forced convection is formed through the rotation of the crucible 110, and the natural convection is formed through a temperature deviation of the melt. When the forced convection and the natural convection are activated, the temperature gradient of the melt surface is increased, and a deviation in temperature gradient along a horizontal direction of the melt surface is reduced.

In order to grow a silicon single crystal having a large diameter, silicon is grown under a high temperature for a long time. Since the upper heater part 170 is located over surface of the silicon melt, and also functions as a heat insulation member which prevents heat adjacent to the melt from being discharged out, there is an effect in that a silicon single crystal with a large diameter may be stably grown.

Figure 2:
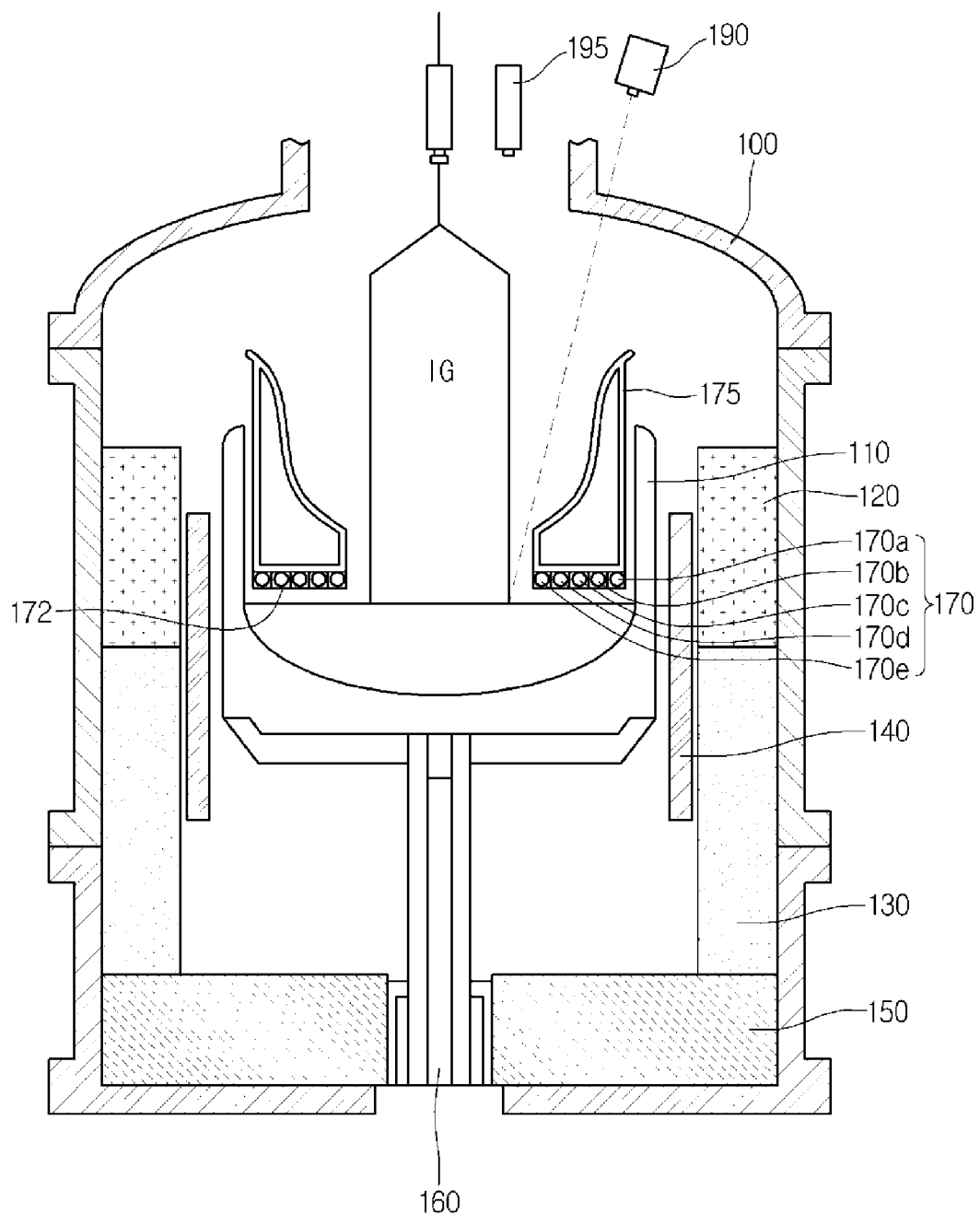
FIG. 2 is a cross-sectional view illustrating an apparatus for growing a single crystal according to a second embodiment.

FIG. 2 is a cross-sectional view illustrating an apparatus for growing a single crystal according to a second embodiment.

Referring to FIG. 2, the second embodiment is characterized by including a heater shield 172 separating each of the plurality of heaters 170a, 170b, 170c, 170d, and 170e of the upper heater part 170 disposed in the apparatus for growing single crystal of the first embodiment. The heater shield may include a side surface blocking film which blocks a side surface of each heater disposed in the heater part 170, and a lower surface blocking film which blocks a lower surface of each heater.

The heater shield 172 may be formed of tungsten or graphite, and is installed to prevent interference in the heat history between neighboring heaters when each heater operates. That is, in order to more accurately control the temperature of silicon melt, heat generated in each heater should be transferred to a solid-liquid interface located vertically under each heater with a minimal change.

That is, the heater shield 172 is installed to minimize the effect of neighboring heaters, when each heater of the upper heater part 170 transfers heat to the silicon melt. To this end, a material which forms a reflective film is coated onto the heater shield 172 located between individual heaters of the upper heater part 170, so that interference in heat history may be more effectively prevented. Also, the heater shield 172 located under the upper heater part 170 can be opened/closed according to a turned on state or a turned off state of individual heaters of the upper heater part 170, so that the temperature state of the silicon melt located under a turned-on individual heater of the upper heater part 170 may be more accurately controlled.

The heater shield 172 is located under a heat insulation member 172, and each heater shield 172 may be coupled by forming a groove under the heat insulation member 172. The grooves are designed to meet a process condition, and the heater shield 172 may thus be flexibly coupled and applied corresponding to the number of heaters in the upper heater part 170.

The apparatus for growing a single crystal which further includes the heater shield 172 in the upper heater part 170, may provide a uniform thermal environment for the silicon melt accommodated in the crucible, and prevents localized solidification of the silicon melt, so that the quality of a silicon single crystal and the ingot pulling speed may be readily controlled.

Also, a thermal environment around an interface of a silicon single crystal can be controlled. Thus, poly silicon is quickly melted in a crucible, so that there is an effect in that the process time required to grow a single crystal can be reduced.

Figure 3:
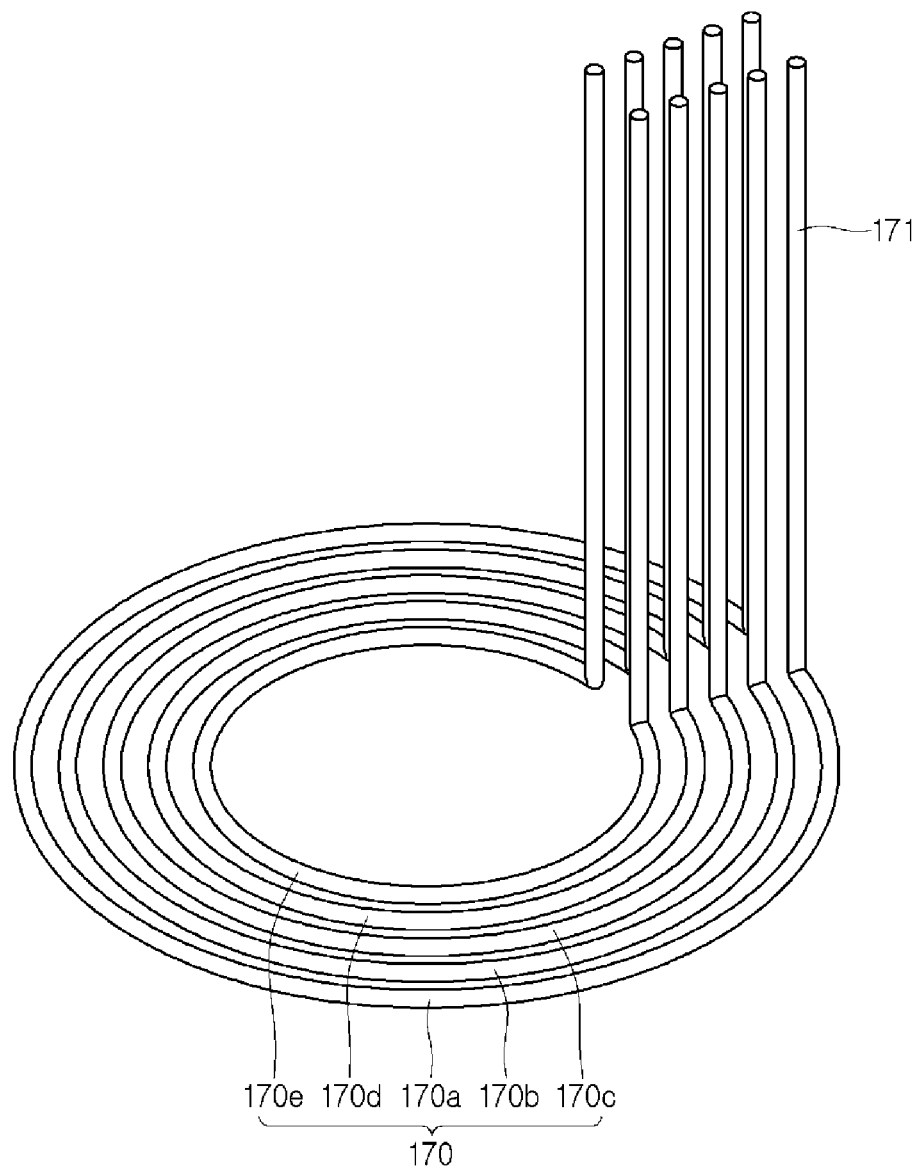
FIG. 3 is a perspective view illustrating an upper heater part disposed in the apparatus for growing a single crystal according to an embodiment.

FIG. 3 is a detailed view illustrating only the upper heater part 170 disposed in the apparatus for growing a single crystal of embodiments.

Referring to FIG. 3, each of the ring-shaped individual heaters 170a, 170b, 170c, 170d, and 170e of the upper heater part 170 is integrally formed, and a support frame 171 for supporting the upper part 170 may be disposed at an arbitrary end and an opposite end of each heater. The support frame 171, which functions as a means for supporting each of the individual heaters 170a, 170b, 170c, 170d, and 170e so that a predetermined distance may be maintained, may also be formed in a different shape, and the view illustrated in FIG. 3 is only an example.

The support frame 171 may pass through a upper heat insulation member 175 located thereover, and may be coupled to a chamber inside the apparatus for growing a single crystal. Also, the individual heaters 170a, 170b, 170c, 170d, and 170e may be firmly coupled to the upper heat insulation member 175 located thereover by a groove formed on the heat insulation member.

Figure 4:
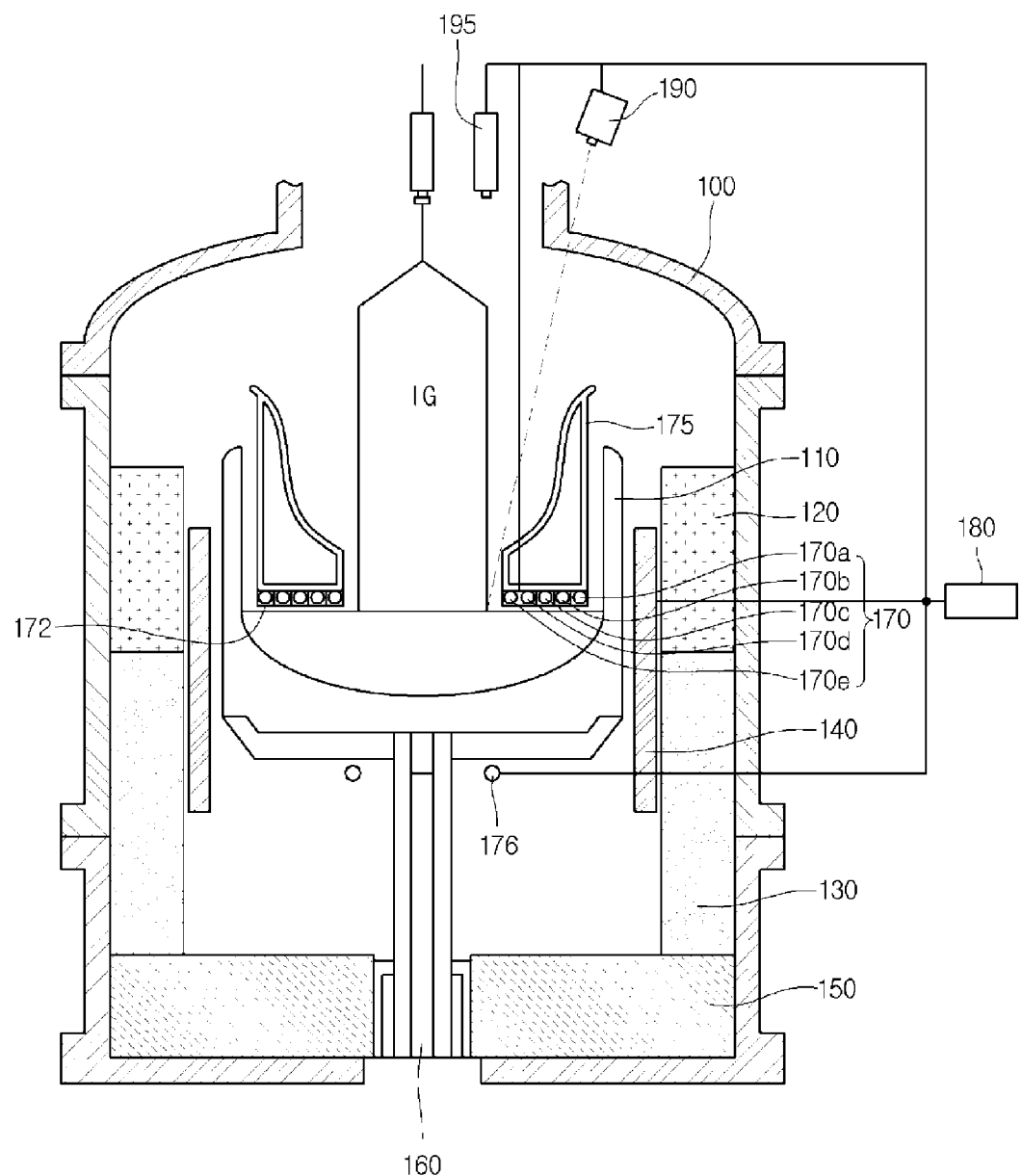
FIG. 4 is a view illustrating an apparatus for growing a single crystal according to a third embodiment.

FIG. 4 is a view illustrating an apparatus for growing a single crystal according to a third embodiment.

Referring to FIG. 4, the third embodiment may further include a lower heater part 176 in the apparatus for growing a single crystal of the third embodiment. Also included may be a control unit 180 which connects the lower heater part 176, the main heater part 140, and the upper heater part 170, and a programmable logic controller (PLC) may be used, for example.

The lower heater part 176 is located under a crucible support member, and may be formed in a ring shape as the upper heater part 170. The lower heater part 176 is installed to control the temperature at the lower portion of the silicon melt, and may be turned on/off according to the controlling by the control unit. The lower heater part 176 is turned on in a process in which a solid raw material, such as poly silicon, is melted in a crucible, so that the poly silicon may be uniformly melted at upper and lower portions of the crucible.

Through a PLC, which is the control unit 180, a user adjusts heater power by controlling the operations of the lower heater part 176, the main heater part 140, and the upper heater part 170, so that the temperature of each portion of the silicon melt may be controlled. The control unit 180 is connected to a pyrometer 195 disposed over the chamber, records temperature information at each position of the silicon melt, determines a portion having a lower or higher temperature than neighboring portions, so that high power or low power may be applied to an individual heater located over that portion. Also, an image of a solid-liquid interface is captured by a camera 190, and the temperature is determined through shape and color information on the solid-liquid interface, which is then transmitted to the control unit 180.

Accordingly, the temperature of the silicon melt is made to have a constant temperature gradient along a diameter direction with respect to the center of a silicon ingot, and also the main heater part and the lower heater part are controlled, so that an environment suitable for process conditions for the silicon single crystal ingot may be controlled.

Hereinafter, disclosed will be a method for preparing a silicon single crystal ingot using the apparatus for growing a silicon single crystal of embodiments.

A method for growing single crystal using the Czochralski method is used. First, a preparation step is a step for preparing poly silicon and a single crystal seed from which a silicon single crystal is grown. The single crystal seed is put into a front end of a crucible, then the crucible containing poly silicon and the single crystal seed is mounted to a heat zone inside the apparatus for growing a single crystal. Here, the crucible is located to be a shape in which the central portion of the crucible is surrounded by a plurality of heaters.

Next, in a step of performing a heat treatment to the poly silicon and the single crystal seed filled in the crucible, melting into silicon melt is performed by operating a main heater part and an upper heater part. In this step, power is supplied to the apparatus for growing a single crystal, so that the main heater part disposed around the crucible and a plurality of heaters disposed over the crucible are heated, and the heating temperature and the speed of temperature elevation may be controlled by a control unit. Here, a lower heater part is additionally heated, so that melting of the poly silicon inside the crucible may be controlled.

The final step is a step for preparing a single crystal by solidifying the molten poly silicon and the molten single crystal seed. In a body process of a silicon single crystal, a plurality of individually controllable heaters disposed in the upper heater part are controlled. That is, power is increased from a heater 170e which is disposed to be the nearest to a growing silicon single crystal ingot toward a direction of a heater 170a which is disposed to be the nearest to a side wall of a quartz crucible. That is, the heating temperature is controlled to be increased, so that heat applied to a solid-liquid interface may be gradually increased and the solid-liquid interface may be stabilized as a result.

Also, when the temperature gradient of a solid-liquid interface measured by a pyrometer and a camera during a body process of a silicon single crystal is high or low at a specific position, the highest level of power is applied to a heater 170e disposed nearest to a growing silicon single crystal ingot, or the highest level of power is applied to a heater 170a disposed nearest to a side wall of the quartz crucible, or the highest level of power is applied to a heater 170c located at a middle of a plurality of upper heater parts, so that a uniform thermal environment may be provided to the silicon melt, and accordingly a high quality silicon single crystal ingot may be prepared.

Accordingly, embodiments employ a plurality of individually controllable heaters which are disposed in the upper heater part, so that a uniform environment may be provided to the silicon melt accommodated in the crucible, and localized solidification of the silicon melt can be prevented so that the quality of a silicon single crystal and the ingot pulling speed can be readily controlled.

Also, a low heater part as well as a main heater part is employed, so that poly silicon is quickly melted in the crucible, and the process time for growing a single crystal may be reduced.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

INDUSTRIAL APPLICABILITY

Since embodiments can be realized in an apparatus for growing a single crystal used for manufacturing a wafer, the embodiments have industrial applicability.

What is claimed is:

1. An apparatus for growing a single crystal, the apparatus comprising:
    a chamber comprising a crucible accommodating silicon melt;
    a support shaft rotating and lifting the crucible while supporting the crucible;
    a main heater part disposed beside the crucible to apply heat to a side of the crucible;
    an upper heat insulation member located over the crucible;
    an upper heater part located at a lower end portion of the upper heat insulation member; and
    a heater shield separating each of a plurality of heaters disposed at the upper heater part and blocking heat transfer between neighboring heaters,
    wherein the upper heater part comprises a plurality of ring-shaped heaters which are spaced apart from each other and have different diameters from each other with respect to a center of the crucible, and
    wherein the heater shield comprises a side surface shield film blocking a side surface of each heater disposed in the upper heater part, and a lower surface shield film blocking a lower surface of each heater.

2. The apparatus according to claim 1, further comprising a plurality of pyrometers located over the chamber, and determining a temperature of a solid-liquid interface of a silicon single crystal.

3. The apparatus according to claim 1, further comprising a camera located outside the chamber, and determining a temperature of a solid-liquid interface of a silicon single crystal by capturing an image of a solid-liquid interface of the silicon single crystal.

4. The apparatus according to claim 1, further comprising a control unit connected to the upper heater part, wherein each heater of the upper heater part can be individually operated through a user selection according to temperature information on a solid-liquid interface, the information being transferred to the control unit.

5. The apparatus according to claim 1, wherein the shield films are coated with a reflection film for blocking heat between neighboring heaters.

6. The apparatus according to claim 1, wherein the heater shield is made of graphite or tungsten.

7. The apparatus according to claim 1, further comprising a control unit connected to the upper heater part, wherein the control unit differently adjusts power for each heater disposed in the upper heater part or turns on only an arbitrary heater according to temperature information on a solid-liquid interface.

8. The apparatus according to claim 7, further comprising a ring-shaped lower heater disposed under a crucible support member while surrounding the support shaft, and connected to the control unit.

9. The apparatus according to claim 8, wherein the control unit turns on/off the lower heater according to a melting state of a silicon single crystal.

10. The apparatus according to claim 8, wherein the upper heater part, the main heater part, and the lower heater are each individually operable through a user selection.

* * * * *